United States Patent [19]

Dearnaley et al.

[11] 4,290,825

[45] Sep. 22, 1981

[54] SEMICONDUCTOR DEVICES CONTAINING PROTONS AND DEUTERONS IMPLANTED REGIONS

[75] Inventors: Geoffrey Dearnaley, Abingdon, England; Kenneth Steeples, Edinburgh, Scotland; Ian J. Saunders, Morecambe, England

[73] Assignee: United Kingdom Atomic Energy Authority, London, England

[21] Appl. No.: 11,959

[22] Filed: Feb. 13, 1979

[30] Foreign Application Priority Data

Feb. 15, 1978 [GB] United Kingdom ................. 5675/78

[51] Int. Cl.³ .......................................... H01L 21/265
[52] U.S. Cl. .................................. 148/33.4; 148/1.5; 357/91
[58] Field of Search ....................... 148/1.5, 33.4, 187; 357/91, 13

[56] References Cited

U.S. PATENT DOCUMENTS 3,805,376  4/1974  D'Asaro et al. ...................... 29/590

OTHER PUBLICATIONS

Foyt et al. Solid St. Electronics, 12 (1969) 209.
Sattler et al. Phys. Rev. 161 (1967) 244.
Upadhyayula et al. Electronic Lelts., 11 (1975) 201.
Ohmura et al. Phys. Stat. Solidi, 15a (1973) 93.

Primary Examiner—Upendra Roy
Attorney, Agent, or Firm—Larson and Taylor

[57] ABSTRACT

A process for manufacturing gallium arsenide devices in which regions of high resistivity are created in the gallium arsenide by subjecting the regions to bombardment by protons and then by deuterons, and devices so made.

10 Claims, 2 Drawing Figures

SEMICONDUCTOR DEVICES CONTAINING PROTONS AND DEUTERONS IMPLANTED REGIONS

The present invention relates to semiconductor devices made from gallium arsenide, or other semiconductor materials which experience an increase in resistivity when subjected to bombardment with protons.

Gallium arsenide is a semiconductor material which is becoming increasingly important, particularly for use in devices which operate at frequencies equivalent to the microwave region of the electromagnetic spectrum. Gallium arsenide also can be used for optical devices such as photodiodes, lasers and light-emitting diodes.

In order to produce such devices, it is necessary to provide regions of high resistivity within a substrate having a generally lower resistivity. One way of doing this is to bombard appropriate regions of a body of gallium arsenide with protons through a mask which is formed on the surface of the body of gallium arsenide by techniques which are well known in the semiconductor art. Although devices produced in this way are useful, due to the relatively high mobility of protons in gallium arsenide, the maximum operating temperature of proton implanted gallium arsenide devices is about 250° C. At operating temperatures approaching this value, defect sites in the gallium arsenide lattice, with which the protons are associated, are annealed out, with a consequent loss of the carrier traps provided by the proton-defect complexes, and the conductivity rises. Eventually the device fails.

According to the present invention in one aspect, there is provided a process for producing regions of high resistivity in a semiconductor substrate body of the type described, comprising the operations of implanting protons into the said regions of the substrate with energies up to a maximum value corresponding to a desired depth of penetration of the protons into the substrate, and implanting deuterons into the said regions of the substrate with energies such as to give the same depth of penetration as for the protons.

Preferably the semiconductor material is gallium arsenide and the doses of protons and deuterons are related to the initial carrier concentration of the gallium arsenide substrate. For example, if the initial carrier concentration of the gallium arsenide is of the order of $10^{18}$ carriers per cubic centimeter, then the proton dose should be of the order of $10^{14}$ per square centimeter. The deuteron dose should be of the same order of magnitude as the proton dose.

Preferably the implantations are carried out in a series of well-defined energy steps, the proton implantation being completed before the implantation of the deuterons is begun.

According to the invention in another aspect there is provided a semiconductor device comprising a substrate body including regions of low resistivity separated by regions into which protons and deuterons have been implanted to form substantially uniform layers of resistivity and dimensions such as to isolate electrically the regions of the substrate of low resistivity.

The invention will now be described, by way of example, with reference to the accompanying drawings, in which.

Figure 1:
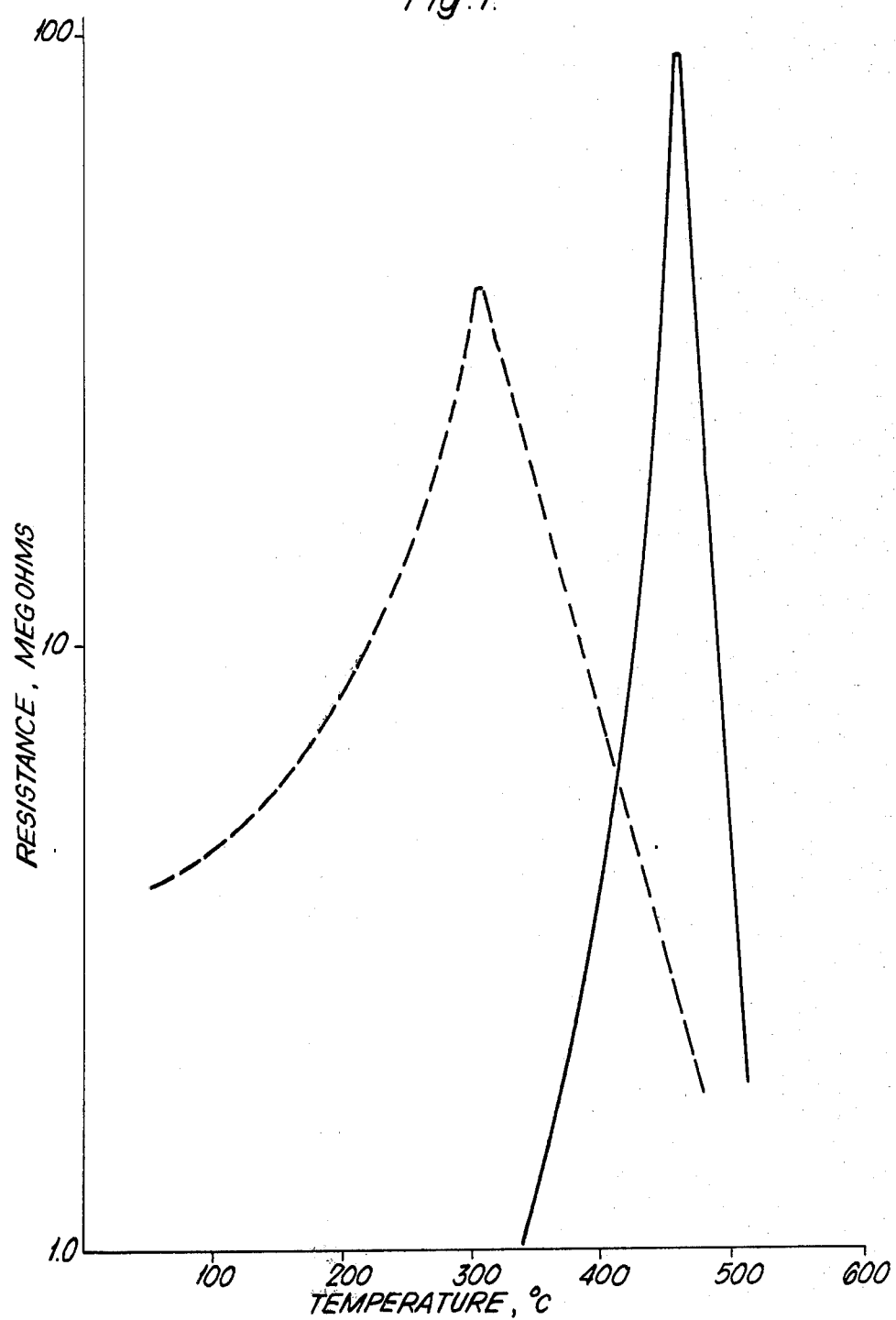
FIG. 1 illustrates changes in the resistivity of a gallium arsenide substrate due to the implantation of protons and deuterons.

Referring to FIG. 1, the dotted curve shows the temperature variation of the resistivity of a specimen of gallium arsenide which has been implanted with protons, and the full curve shows the temperature variation of the resistivity of a specimen of gallium arsenide which has been implanted with deuterons. The specimens were cut from the same single crystal so that the initial carrier concentrations of the gallium arsenide specimens were the same, and the implantation doses were the same.

It can be seen that the resistivity of the proton-implanted specimen reaches a maximum value at about 300° C. and decreases rapidly thereafter. On the other hand, the resistivity of the deuteron-implanted specimen does not begin to rise until a temperature of about 400° C. is reached. This difference in behaviour is explicable if one assumes that the increased resistivity of the implanted specimens is due not solely to the creation of defects by elastic collisions between the implanted particles and the lattice atoms, but also arises from the migration of the protons or deuterons in the gallium arsenide and the association of the implanted species with pre-existing defect centres, such as vacancies, so as to produce carrier-removing or compensating centres. The decrease in resistivity of the proton-implanted specimen above 300° C. is attributable to the dissociation of the proton-defect complexes, whereas the lower mobility of the heavier deuterons both delays the onset of the increase in resistivity, and its subsequent decrease.

It is this difference in behaviour which is utilised in the present invention.

Figure 2:
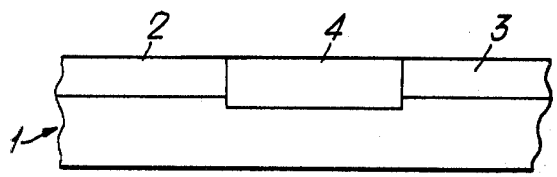
FIG. 2 is a diagrammatic cross-section of part of a semiconductor device embodying the invention.

FIG. 2 shows a part of a semiconductor device consisting of a gallium arsenide substrate 1 of intrinsic conductivity which has a first high-conductivity region 2 and a second high-conductivity region 3 of opposite conductivity type to that of the region 2. The regions 2 and 3 are separated by a region 4 of high resistivity.

The region 4 is formed by bombarding the substrate 1 through an appropriate mask, with a beam of protons, and subsequently a beam of deuterons. The mask, which is not shown, is formed by techniques which are well known in the semiconductor art, and which it is not thought necessary to describe.

The energy of the protons is increased in regular steps from 0.1 to 1 Mev at a constant beam current of about 0.2 $\mu$A per square centimeter, so that a uniform concentration of protons is implanted to a depth of about 10 $\mu$m, this being appropriate for the device being described. The beam intensity at each energy step is about $4 \times 10^{14}$ protons per square centimeter. The beam current is such that although the high resistivity is developed, the substrate 1 does not reach a temperature such that the proton-defect complexes are annealed out.

The region 4 is then bombarded with a beam of deuterons. The deuteron beam energy is increased in the same number of steps as was the proton beam energy, but the energy at each step is approximately 1.2 times that of the corresponding step in the proton beam energy range. This is to ensure that at each stage of the implantation the proton and deuteron ranges in the gallium arsenide are the same. The proton and deuteron beam currents are made to be the same, but the deuteron dose at each energy is arranged to be of the same order of magnitude as that of protons, so that the deuteron concentration in the whole region 4 is about the same order of magnitude as the proton concentration. Finally, the mask is removed and the necessary contracts are applied to the device. This too is done by techniques which are well-known in the semi-conductor art, and which it is not thought necessary to describe.

The deuteron concentration is arranged to be of the same order of magnitude as the proton concentration to ensure that at temperatures below about 250° C., in use, the deuterons make a worthwhile contribution to the resistivity of the region 4. If the temperature of the device should rise to a value at which the proton-defect centres are annealed out, then the deuteron-defect centres come into effect and maintain the resistivity of the region 4 of the device.

We claim:

1. A process for producing regions of high resistivity in a semiconductor substrate body of the type which experience an increase in resistivity when subjected to bombardment with protons comprising the operations of implanting protons into the said regions of the substrate with energies up to a maximum value corresponding to a desired depth of penetration of the protons into the substrate, and implanting deuterons into the said regions of the substrate with energies such as to give the same depth of penetration as for the protons.

2. A process according to claim 1 wherein the semiconductor material is gallium arsenide.

3. A process according to claim 2 wherein the quantities of deuterons and protons implanted are of the same order of magnitude.

4. A process according to claim 2 wherein the gallium arsenide has an initial carrier concentration of the order of $10^{18}$ carriers per cubic centimeter, and the deuteron and proton doses are of the order of $10^{14}$ per square centimeter.

5. A process according to claim 1 wherein the implantation is carried out at a series of energy levels and the proton implantation is carried out before the deuteron implantation.

6. A process according to claim 4 wherein the proton implantation is carried out in ten evenly spaced energy levels between approximately 0.1 and 1.0 MeV.

7. A process according to claim 4 wherein the deuterons are implanted with energies approximately 1.2 times that of the protons.

8. A process according to claim 7 wherein the deuteron implantation is carried out at ten evenly spaced energy levels between approximately 0.12 and 1.2 MeV.

9. A semiconductor device comprising a substrate body including regions of low resistivity separated by regions into which protons and deuterons have been implanted to form substantially uniform layers of high resistivity and dimensions such as to isolate electrically the regions of the substrate of low resistivity.

10. A semiconductor device made according to a process as claimed in claim 1.

* * * * *